United States Patent [19]

Koenig

[11] Patent Number: 4,752,898

[45] Date of Patent: Jun. 21, 1988

[54] EDGE FINDING IN WAFERS

[75] Inventor: Franklin R. Koenig, Palo Alto, Calif.

[73] Assignee: Tencor Instruments, Mountain View, Calif.

[21] Appl. No.: 8,389

[22] Filed: Jan. 28, 1987

[51] Int. Cl.$^4$ ............................................. B65G 47/24
[52] U.S. Cl. ..................................... 364/559; 198/394; 356/400; 414/754; 414/779; 414/786
[58] Field of Search ................ 364/559, 468; 356/400; 198/394; 414/754, 757, 779, 786, 433

[56] References Cited

U.S. PATENT DOCUMENTS

| | | | |
|---|---|---|---|
| 4,242,038 | 12/1980 | Santini | 414/786 X |
| 4,425,075 | 1/1984 | Quinn | 414/755 |
| 4,457,664 | 7/1984 | Judell et al. | 414/779 |
| 4,466,073 | 8/1984 | Boyan et al. | 364/559 |

Primary Examiner—Jerry Smith
Assistant Examiner—Clark A. Jablon
Attorney, Agent, or Firm—Thomas Schneck

[57] ABSTRACT

A system for finding the orientation of a substantially circular disk shaped wafer with at least one flat region on an edge thereof, in which the wafer is spun one 360 degree turn on a chuck and the edge position is measured by a linear array to obtain a set of data points at various wafer orientations. The rotation axis may differ from the wafer center by an unknown eccentricity. The flat angle is found by fitting a cosine curve to the data, subtracting the expected data derived from the cosine curve from the actual data to obtain a deviation. The angle of maximum deviation of the data from the cosine curve is a first estimate of the flat angle. The estimate may be corrected for errors due to a finite number of data points and wafer eccentricity by calculating an adjustment angle from data points on the wafer flat. After determining the flat angle, the wafer is spun to the desired orientation. The wafer eccentricity may be calculated from four of the data points located away from the flat edge region, and the wafer is then centered.

15 Claims, 3 Drawing Sheets

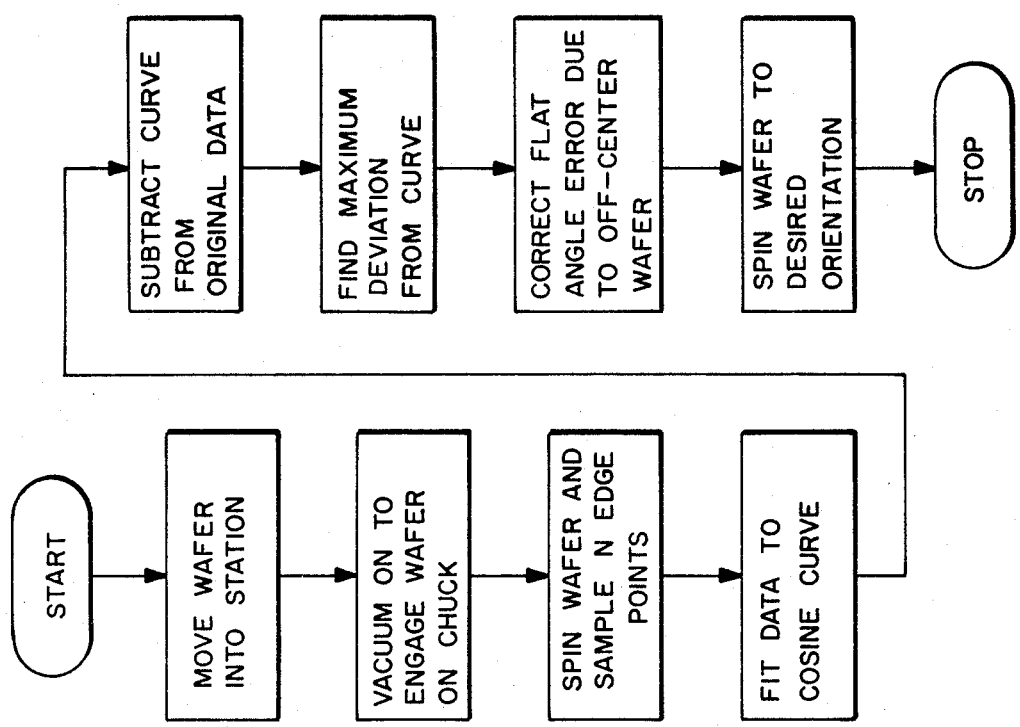
FIG._4.
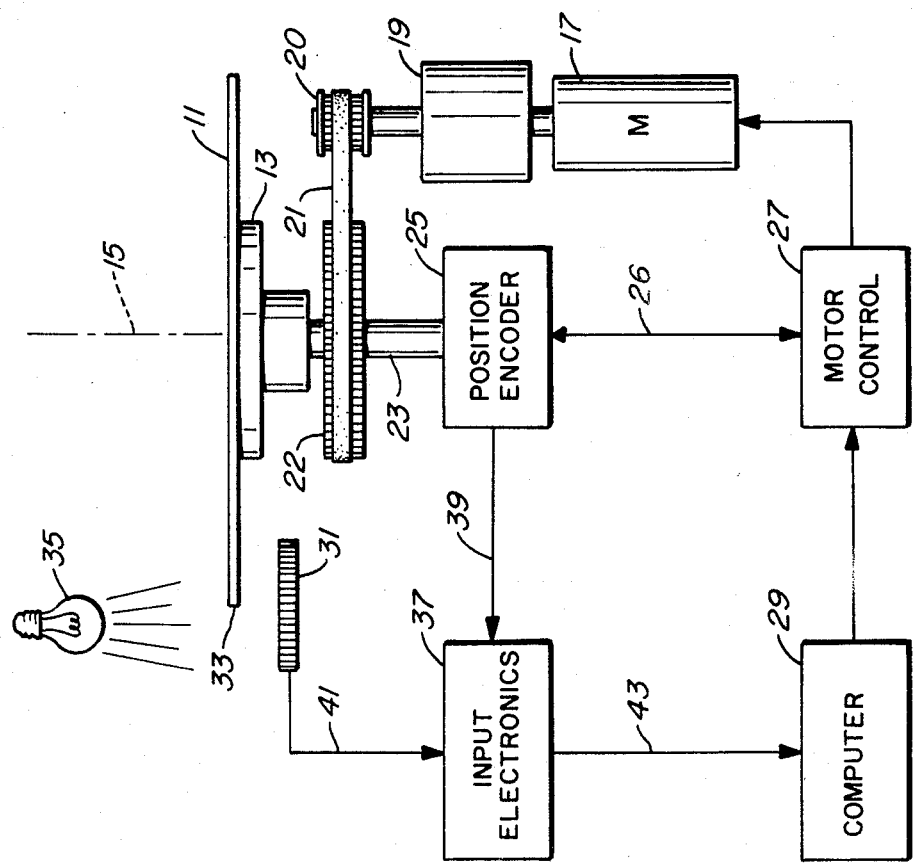
FIG._1.

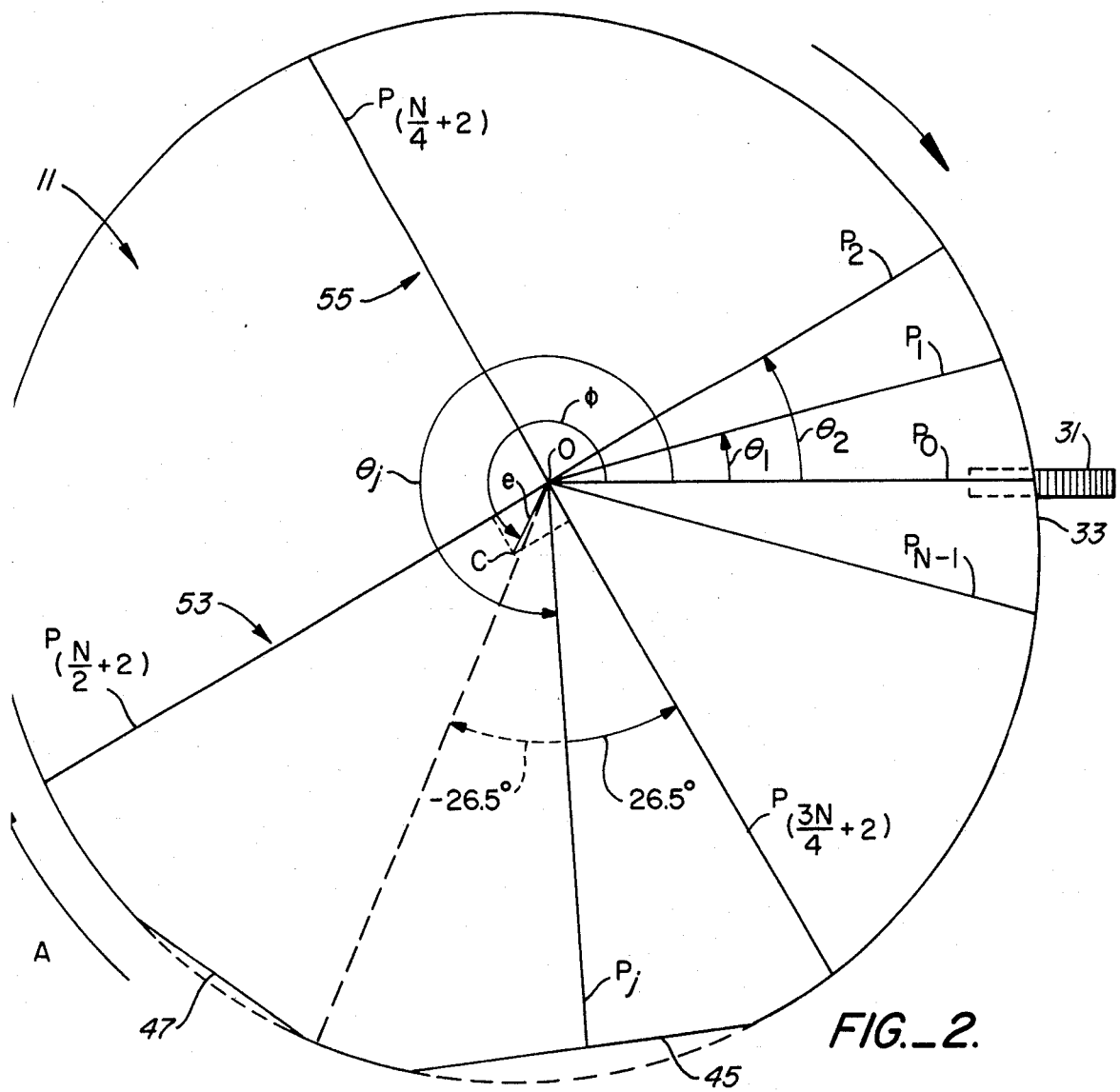
FIG._2.
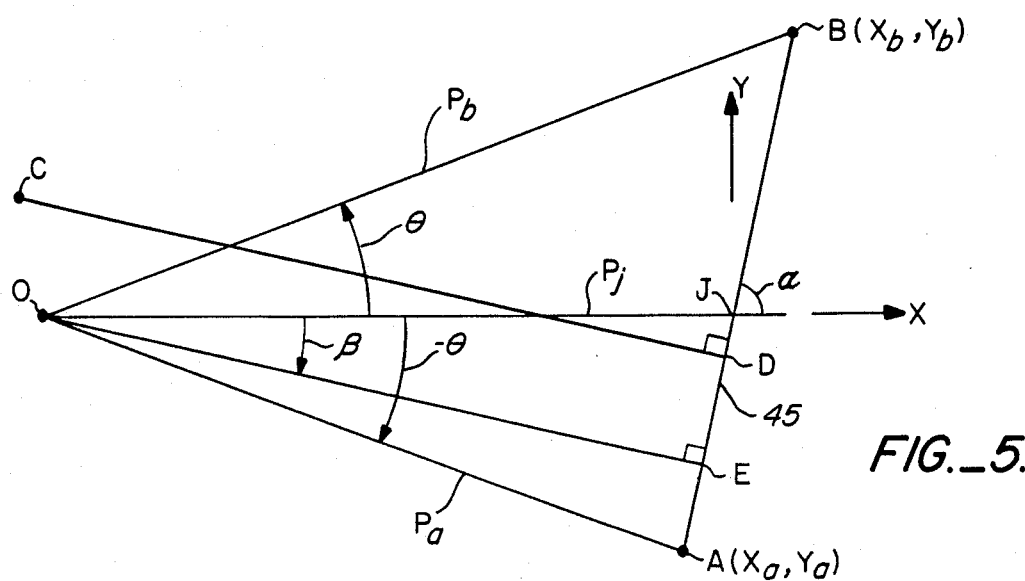
FIG._5.

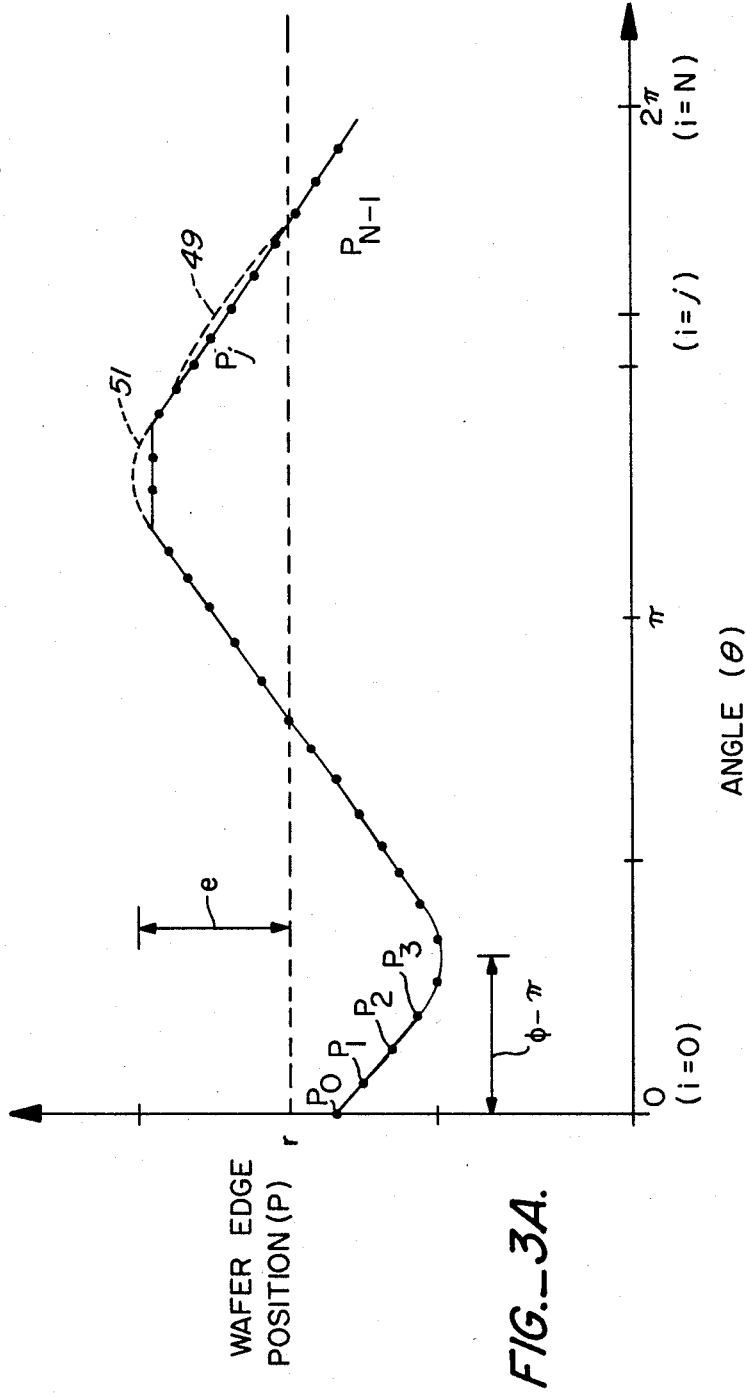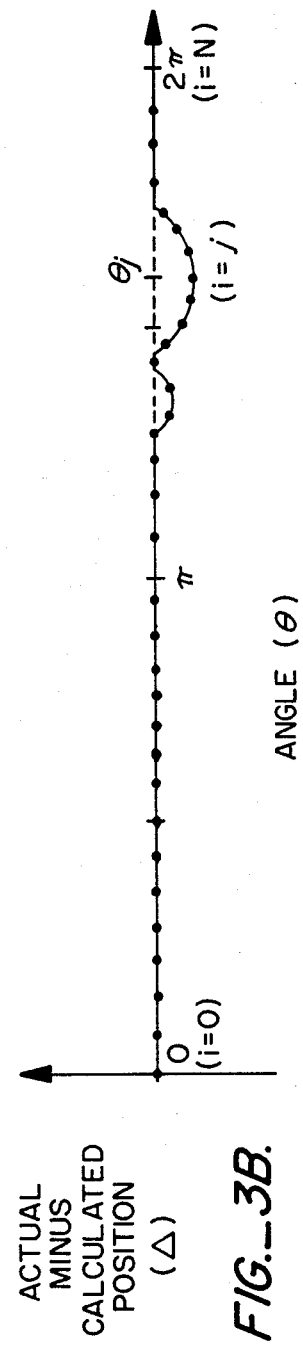

EDGE FINDING IN WAFERS

TECHNICAL FIELD

The present invention relates to a method and apparatus for locating flat edges along the periphery of wafers containing one or more flat edges and in particular to the location of the major flat edge of a wafer. Such wafers are used in the manufacture of semiconductor integrated circuits.

BACKGROUND ART

In U.S. Pat. No. 4,457,664, Judell et al. disclose a wafer alignment station having a capacitive sensor producing an electrical signal representative of the position of the wafer edge along an X axis. The wafer is spun on a vacuum chuck one full turn and the signal is sampled to produce data for a number of points around the wafer. A processor filters out data corresponding to noise and flat edge information, then calculates an eccentricity vector defined between the centroid of the wafer and the point of rotation about the axis of the vacuum chuck. The wafer is then centered on the chuck, and spun a second full turn. Data obtained from this second spin is used to calculate the position of the flat edge region relative to the X axis, and also serves as a check on whether or not the wafer is aligned about its centroid. The wafer is then spun to the desired orientation.

The calculation of the eccentricity vector is accomplished by fitting the filtered data to an equation, derived from a model of predicted observations, in a least squares fit with the X and Y components of the vector and the radius of the wafer as unknowns. Upon solving for the unknowns by means of determinants, the magnitude and direction of the vector is derived. The calculation of the flat position is accomplished by computing a threshold equal to ¾ of the mean value of the data plus ¼ of the value of the minimum data point, identifying the threshold crossings of the data points, and fitting the data between these crossings to a parabola.

Optical flat edge finding apparatus are known and use various techniques to orient the wafer in a desired position. For example, in U.S. Pat. No. 4,418,467 to Iwai, alignment marks are formed on a side of the wafer. In U.S. Pat. Nos. 4,376,581 and 4,461,567 to Mayer, U.S. Pat. No. 4,539,481 to Troukens et al. and U.S. Pat. No. 3,890,508 to Sharp, photodetectors near an edge of a wafer are normally covered by the wafer except when the wafer is properly aligned. At that time, the detectors are adjacent to a flat region and being near the wafer edge are uncovered permitting light to reach them.

Unfortunately, prior art wafer aligners are slowed by the necessity of having an already centered wafer to properly locate the flat region of a wafer and thereby correctly orient the wafer. Two separate steps are thus required. A first step spins the wafer to identify the eccentricity, and the wafer is centered. Then, a second step spins the wafer again to identify the flat region of a wafer, and the wafer is oriented in a desired direction.

It is an object of the present invention to determine edge alignment in a wafer which only requires one spin step to find both the flat edge region and the wafer eccentricity.

It is another object of the invention to determine flat edge region alignment in a wafer wherein the determination does not require the wafer to be spun about its center.

DISCLOSURE OF THE INVENTION

The above objects have been met with a method and apparatus which finds the flat edge region of a wafer with a single 360 degree spin about an axis of rotation, not necessarily at the center of the wafer. After the flat edge is found, the method may additionally determine the eccentricity between the axis of rotation and the wafer center using the same data obtained from the single spin step.

To find the flat edge, a wafer is moved onto a wafer alignment station. A chuck engages the wafer, such as by means of vacuum suction. The wafer is spun a single 360 degree turn and a plurality of edge points are sampled at angular increments by a photodetector array. The photodetector array axis is aligned radially with respect to the chuck's axis of rotation, and is situated partially beneath the edge of the wafer so that the detector cells view the wafer edge. A light source illuminates cells of the array not covered by the wafer so that the number of cells covered by the wafer is indicative of the distance from the edge of the wafer to the axis of rotation. As the wafer is rotated, various cells report the wafer shadow. The transition between shadow and light is the wafer edge. Data corresponding to this transition for one complete revolution of the wafer form a set of wafer edge position data.

A cosine curve is fit to the set of wafer edge position data in a least squares fit, then subtracted from the data. Provided that the wafer eccentricity is not excessive in relation to the flat edge length, the angle at which the sampled data is at a maximum deviation from the cosine curve is a coarse estimate of the flat angle. A fine determination of the flat edge angle may be determined from data points close to the estimated angle by calculating the angle at which a line through the rotation axis intercepts the flat edge of the wafer orthogonally. Once the flat edge angle is known, the eccentricity, i.e. the distance and direction of the center of the wafer from the rotation axis, may be determined from two orthogonal pairs of the data points known not to be part of the wafer flat edge. The data points of each pair are located 180 degrees apart on opposite sides of the wafer, and the difference between the actual measured distances and the average of the two measurements indicates the component of the eccentricity in the direction of the line between the two points. After determining the flat edge angle and eccentricity, the wafer is aligned for transport to the next wafer station.

BRIEF DESCRIPTION OF THE DRAWINGS

FIG. 1 is a simplified plan view of a wafer edge finding apparatus of the present invention.

FIG. 2 is a top plan of a wafer schematically illustrating the sampling of data points as well as the determination of wafer eccentricity in the apparatus of FIG. 1.

FIG. 3A a graph of wafer edge position vs. wafer angle showing a cosine curve fit to the data points sampled in accord with the plan of FIG. 2.

FIG. 3B is a graph of actual minus calculated position vs. wafer angle derived from the cosine curve fit in FIG. 3A.

FIG. 4 is a flow diagram showing steps in the method of the present invention.

FIG. 5 is a geometric diagram illustrating the parameters for finely determining the flat edge angle for the wafer illustrated in FIG. 2.

BEST MODE FOR CARRYING OUT THE INVENTION

With reference to FIG. 1, a wafer 11 is engaged on a chuck 13, usually, but not necessarily, as part of a wafer alignment station. The chuck 13, which is typically vacuum operated, is rotatable about an axis 15, being driven by a servo controlled motor 17. Motor 17 transmits power to a shaft 23 extending axially from beneath chuck 13 through a gearbox 19 and a belt drive 21. Typically, gearbox 19 produces a speed reduction of about 30 to 1, while belt drive 21 provides an additional 3 or 4 to 1 speed reduction due to the different diameters of capstans 20 and 22 around which belt 21 is wrapped. The resulting overall speed reduction provides for finer control of chuck rotation speed by minimizing the total rotational inertia at the motor.

A position encoder 25 is connected to the base of shaft 23 for determining the orientation of the chuck 13, as well as any wafer 11 engaged on chuck 13, with respect to an initial orientation. Position encoder 25 is a transducer which converts angular position into a representative digital electrical signal. Such position encoders are well known. The signal is transmitted along a line 26 to a motor servo control circuit 27. Motor control 27 communicates with motor 17 and in response to a signal from a computer 29 turns motor 17 on or off. Motor control 27 also adjusts the speed of motor 17 in response to the angular position signal from position encoder 25 in order to maintain a constant known speed.

A linear photodetector array 31 is disposed beneath an edge 33 of wafer 11 so that array 31 is partially covered by wafer 11. A light source 35 illuminates edge 33 and only that portion of detector cells of array 31 which is not covered by wafer 11. Array 31 is aligned radially with respect to rotation axis 15 so that the number of unilluminated detector cells is indicative the position of edge 33 with respect to axis 15, i.e. the distance of edge 33 from axis 15. The edge position measured in terms of unit detector cell width is equal to the number of unilluminated detector cells plus the detector offset, i.e. the number of detector cell widths between the rotation axis and the end of the detector array nearest the rotation axis. Detector offset is about 4,800 cell widths for a 6 inch wafer, and detector array 31 typically has about 1,700 cells. Accordingly, array 31 detects the position of edge 33 and sends a signal along bus 41 representative of the number of unilluminated cells and thus of edge position to input electronics 37. Input electronics 37 also receives a signal along bus 39 from position encoder 25 representative of the orientation of chuck 13 and thus of wafer 11. As chuck 13 with wafer 11 spins, input electronics 37 samples the incoming orientation angle and edge position signals from buses 39 and 41 respectively, for a plurality of wafer orientations. Typically, in a single 360 degree wafer rotation, about 500 orientation angles and corresponding edge positions are sampled at constant angular increments. The resulting data points are sent via a bus 43 to computer 29 for processing.

With reference to FIG. 2, a linear detector array 31 detects the position of edge 33 of wafer 11 with respect to the axis of rotation of the wafer, here labelled as origin O. The wafer is substantially of a circular disk shape with at least one flat region 45, hereafter called the major flat of the wafer. A minor flat 47 may also be present. The center C of wafer 11 does not necessarily coincide with the rotation axis O, and in FIG. 2 center C is a distance e, hereafter called the eccentricity, away from axis O at an angle $\phi$ with respect to the initial orientation of the wafer. Wafer 11 is rotated clockwise in FIG. 2 as represented by arrows A. However, the direction of rotation, clockwise or counterclockwise, is not critical.

As the wafer rotates, the position of edge 33 is sampled for various orientation angles. Each data point i is represented by an orientation angle $\theta_i$ and a corresponding position $P_i$, where the position $P_i$ is the distance from axis O to edge 33 at array 31 when the wafer has rotated by angle $\theta_i$ from the initial position. Thus, for example, at the initial position shown in FIG. 1, a data point is determined to be $(\theta_0, P_0)$. $\theta_0 = 0$ by definition. After a clockwise rotation by an angle $\theta_1$, another data point is sampled and is indicated by $(\theta_1, P_1)$. After a clockwise rotation by a further amount $\theta_2 - \theta_1$ for a total rotation by an angle $\theta_2$, a third data point is sampled and is indicated by $(\theta_2, P_2)$. A plurality N of data points are sampled in one 360 degree rotation, so the final data point is given by $(\theta_{N-1}, P_{N-1})$. Typically, the data points are sampled by incremental angular amounts, i.e.

$$\theta_i = \frac{2\pi}{N} i \text{ radians} \qquad (1)$$

where N is the number of data points. Typically N is about 500.

The resulting set of data points is graphed in FIG. 3A for edge position vs. orientation angle. The set of points are connected by line segments to show that the data set approximates a cosine curve. For a perfectly circular disk of radius r rotated about an axis O with the center C located an eccentricity e and angle $\phi$ from the axis, the data fits the curve $$P_i = \sqrt{r^2 - (e \sin(\theta_i - \phi))^2} + e \cos(\theta_i - \phi) \qquad (2)$$

For small e/r this may be approximated by the following:

$$\hat{P}_i = r + e \cos(\phi - \theta_i) \qquad (3)$$

where $\hat{P}_i$ is the expected position measurement corresponding to orientation angle $\theta_i$. Note this is only correct when e/r is small, i.e. when the eccentricity is small which is what will be assumed here. Expanding the cosine term in equation (3) we obtain $$\hat{P}_i = r + (e \cos\phi) \cos\theta_i + (e \sin\phi) \sin\theta_i \qquad (4)$$

In order to fit the expected position measurement to the actual measurements for unknown radius and center we must be able to determine the values of r, $e \cos\phi$ and $e \sin\phi$ from the data. The radius r is best approximated by $$r = \frac{1}{N} \sum_{i=0}^{N-1} P_i \qquad (5)$$

the average of all the position measurements (again e/r assumed to be small). The cosine term, $e \cos\phi$ is best approximated by $$e \cos \phi = \frac{2}{N} \sum_{i=0}^{N-1} P_i \cos \theta_i, \text{ and} \qquad (6)$$

the sine term $e \sin \phi$ is best approximated by $$e \sin \phi = \frac{2}{N} \sum_{i=0}^{N-1} P_i \sin \theta_i. \qquad (7)$$

Accordingly, the best fit of the expected position measurements for circular wafers to the actual measurements is satisfied by:

$$\hat{P}_i = r + (e \cos \phi) \cos \theta_i + (e \sin \phi) \sin \theta_i, \qquad (8)$$

where r, $e \cos \phi$ and $e \sin \phi$ are given in equations (5), (6) and (7) respectively, and where $\theta_i$ is preferably given by equation (1).

Wafer 11 is substantially of a circular shape but also has at least one flat region 45. Wafer 11 may also have additional flat regions 47. The largest flat region 45 is termed the major flat, and it is the orientation angle $\theta_j$ at the center of this major flat, called hereafter the flat angle $\theta_j$, which is sought. After fitting the data to the cosine curve given by equation (8), the method of the present invention determines an estimate of the flat angle $\theta_j$. The flat regions 45 and 47 in the wafer 11 of FIG. 2 are represented in the measured data points by deviations from the expected cosine curve, indicated in FIG. 3A by dashed lines at regions 49 and 51. The deviation $\Delta_i$ of the edge position $P_i$ for each data point i from the expected position $P_i$ derived from the cosine curve in equation (8) is given by the equation $$\Delta_i = P_i - \hat{P}_i, \qquad (9)$$

for all data points i from O to N−1. This deviation is shown in FIG. 3B for wafer 11 of FIG. 2. Note that it is not necessary to calculate r to find the maximum deviation. The location on the graph showing the greatest deviation of the data from the cosine fit, i.e. where $\Delta_i$ is minimized, is a good estimate of the flat angle $\Theta_j$, typically within plus or minus 1.5 degrees.

With reference to FIG. 4, a method for aligning a wafer comprises first moving a wafer onto a wafer alignment station. The station is preferably like that shown in FIG. 1, with a rotatable vacuum chuck for engaging the wafer and a linear array for detecting the edge of the wafer. Accordingly, the wafer is engaged on the chuck, such as by turning on vacuum suction, the wafer is spun for one 360 degree rotation, and a plurality N of data points each consisting of an orientation angle and an edge position are sampled. Computer 29 in FIG. 1 initiates these actions by sending a signal to motor control 27 to turn on motor 17 and to set position encoder 25 to an initial orientation. Data points are sampled by input electronics 37 receiving signals from position encoder 25 and linear array 31. The data points are then transferred to computer 29 for processing.

Computer 29 performs the operations indicated by equations (5), (6), (7) and (8) to fit a cosine curve to the data points, the expected position measurements $\hat{P}_i$ for each orientation angle $\theta_i$ being by equation (8). Then these expected measurement are subtracted from the corresponding original position measurements $P_i$ to obtain the deviation $\Delta_i$ of the actual data from the calculated cosine curve. The computer then locates the angle $\theta_j$ of maximum deviation from the cosine curve, i.e.

where $\Delta_i$ is minimum, the angle $\theta_j$ being a good estimate of the flat angle.

Since the sampled data point at orientation angle $\theta_j$ need not fall exactly at the flat angle, and since the axis of rotation does not coincide with the center of the wafer, a fine adjustment to the estimate $\theta_j$ of the flat angle may be made to correct the estimate to the flat angle. Referring to FIG. 5, a major flat region 45 of a wafer is seen, along with a rotation axis O, and a wafer center C. Three position measurements $P_a$, $P_j$ and $P_b$ are indicated. A data point J at an orientation angle $\theta_j$ and with position measurement $P_j$ is estimated to approximate the location of the center of flat region 45 by means of the method discussed above. Angle $\theta_j$ is an estimate of the flat angle which deviates from the true flat angle by an amount $\beta$ to be determined.

The flat edge region may be viewed as a chordal cut in the circular disk shaped wafer. Thus, a line through the center C of the wafer and through the center D of the flat edge intersects the flat edge perpendicularly. A line through rotation axis O and data point J intersects the flat edge at an angle $\alpha$. To determine the adjustment $\beta$ needed to angle $\theta_j$, two data points A and B are selected on each side of data point J. Typically, these are data points at angles $\theta_{j-k}$ and $\theta_{j+k}$ selected such that their angular separation is maximized while ensuring that A and B lie on the flat. Data points A and B are preferably at equal angles $\theta$ away from data point J relative to rotation axis O for computatioral simplicity.

From triangle OEJ it is clear that adjustment angle $\beta = 90° - \alpha$. If points A and B are a.ssigned coordinates $(X_a, Y_a)$ and $(X_b, Y_b)$ respectively, the X-axis being defined as parallel to line OJ, then $$\tan \beta = \tan (90° - \alpha) = \cot \alpha = \frac{X_b - X_a}{Y_b - Y_a} \qquad (10)$$

Transforming equation (10) to polar coordinates about rotation axis O, we get $$\tan \beta = \frac{P_b \cos \theta - P_a \cos (-\theta)}{P_b \sin \theta - P_a \sin (-\theta)} = \frac{P_b - P_a}{P_b + P_a} \cot \theta \qquad (11)$$

Finally, we get $$\beta = \tan^{-1} \left( \frac{P_b - P_a}{P_b + P_a} \cot \theta \right) \approx \frac{P_b - P_a}{P_b + P_a} \cot \theta \qquad (12)$$

for small $\beta$.

Adjustment angle $\beta$ is positive for $P_b > P_a$, so to obtain a truer estimate of the flat angle, angle $\beta$ is subtracted from the first estimate $\theta_j$, the angle of greatest deviation of the data from the expected cosine curve.

Returning to FIG. 4, once the flat angle has been corrected, the wafer may be spun to a desired preset orientation, and the wafer transferred to the next station for additional manufacturing steps or for measuring and testing. It may also be required that the wafer be centered on the chuck prior to transfer. The center C of the wafer may be found from the original data points.

With reference to FIG. 2, four data points are selected for calculating the location of wafer center C. For example, position $P_2$ at orientation angle $\theta_2$ may represent a first data point. A second data point is represented by position measurement $$P_{\frac{N}{4}+2},$$

a third data point is represented by position measurement $$P_{\frac{N}{2}+2},$$

and a fourth data point is represented by position measurement $$P_{\frac{3N}{4}+2}.$$

When selecting these data points, all of the data points should be located away from any flat region 45 or 47 on wafer edge 33. In standard size wafers used in the semiconductor industry, the major flat 45 cuts an arc of about 38 to 46 degrees. Thus, one end of the major flat is located at most 23 degrees away from the center of the flat, as determined by the flat angle. Also in standard size semiconductor wafers a minor flat is centered 45 degrees from the major flat angle and cuts an arc of about 20 to 30 degrees. Thus, an end of the minor flat nearest the major flat is located at least 30 degrees away from the center of the major flat. Accordingly, one data point may be selected with an orientation angle of from 23 to 30 degrees from the flat angle. Preferably, the first data point is selected at an orientation angle of $\theta_j \pm 26.5°$, where $\theta_j$ is the adjusted flat angle determined above.

The first and third data points are located 180 degrees apart from one another. The second and fourth data points are located 180 degrees apart from one another, and 90 degrees apart from the first and third data points respectively. Thus, the first and third data points define a first line 53 through rotation axis O between the first and third data points, and the second and fourth data points define a second line 55, orthogonal to first line 53, through rotation axis O between the second and fourth data points.

Averaging the position measurements $$P_2 \text{ and } P_{\frac{N}{2}+2},$$

of the first and third data points and subtracting from one of the position measurements of the first and third data points determines the projection of the wafer center C onto first line 53. A positive value after the subtraction step indicates that the center is closer to the edge of data point used in the subtraction. Likewise, the position measurements $$P_{\frac{N}{4}+2} \text{ and } P_{\frac{3N}{4}+2}$$

of the second and fourth data points are averaged and subtracted from the position measurements of one of the second and fourth data points to calculate the projection of the wafer center C onto second line 55. Successively moving the wafer on the chuck parallel to the first and second lines 53 and 55 by the amount of the calculated projections, i.e. until the wafer center C and rotation axis O coincide, centers the wafer.

With the method of the present invention, semiconductor wafers may be aligned, i.e. oriented and centered, quickly. Typically, a six inch diameter wafer can be aligned in at most 3 seconds. The speed is achieved by enabling the flat region of a wafer to be identified without requiring that the wafer be spun about its center, and thereby requiring only one, instead of two, 360 degree spin steps to sample edge positions for determining both the flat angle and wafer eccentricity.

I claim:
1. A method of locating the peripheral flat edge of a wafer comprising,
    (a) placing a wafer onto a wafer chuck rotatable about an axis,
    (b) spinning said wafer about said axis for one 360 degree rotation,
    (c) determining the orientation of said chuck with respect to an initial orientation,
    (d) sampling the position of said edge of said wafer for a plurality of chuck orientations to obtain a set of data points, each data point consisting of an orientation angle and a corresponding edge position,
    (e) fitting a cosine curve to said set of data points,
    (f) subtracting said cosine curve at each of said orientation angles from said corresponding edge positions to obtain a second set of points representing the deviation of said data points from said cosine curve, and
    (g) finding the angle of maximum deviation of said data points from said cosine curve, said angle being an estimate of a flat edge angle indicating the location of said flat edge of said wafer with respect to said axis of rotation.
2. The method of claim 1 further comprising,
    (h) rotating said wafer about said axis to a preselected orientation with respect to said flat edge angle.
3. The method of claim 1 further comprising after step (g),
    finding a fine adjustment to said estimate of said flat edge angle, said fine adjustment being an angle $\beta$ determined according to the equation

$$\beta = \frac{P_b - P_a}{P_b + P_a} \cot \theta,$$

where $P_a$ and $P_b$ are edge positions taken from said set of data points for orientation angles immediately preceding and succeeding said angle of maximum deviation, respectively, and where $\theta$ is the angle between adjacent data points, and
    subtracting said angle $\beta$ from said angle of maximum deviation to obtain a truer estimate of said flat edge angle.
4. The method of claim 1 further comprising after step (g),
    selecting first, second, third and fourth data points from said set of data points located away from any flat edge of said wafer, said first and third data points being 180 degrees apart from one another, said second and fourth data points being 180 degrees apart from one another and 90 degrees apart from said first and third data points respectively, a first line being defined through said axis of rotation between said first and third data points, a second line being defined through said axis of rotation between said second and fourth data points,
    calculating from the corresponding edge positions of said first and third data points a projection of the center of the wafer onto said first line, calculating from the corresponding edge positions of said second and fourth data points a projection of the center of the wafer onto said first line, moving said wafer on said chuck successively parallel to said first and second lines until the center of said wafer and said axis of rotation coincides.

5. The method of claim 4 wherein calculating the projection onto the first line comprises finding the mean of the edge positions of said first and third data points and subtracting said mean from the edge position of one of said first and third data points, and wherein calculating the projection onto the second line comprises finding the mean of the edge position of said second and fourth data points and subtracting said mean from the edge position of one of said second and fourth data points.

6. The method of claim 1 wherein said cosine curve at each of said orientation angles, $\theta_i$ for $i=0$ to $N-1$, N being the number of data points in the set, is represented by the corresponding set of points $\hat{P}_i$ satisfying the equation $$\hat{P}_i = r + (e \cos \phi) \cos \theta_i + (e \sin \phi) \sin \theta_i$$

where $$e \cos \phi = \frac{2}{N} \sum_{i=0}^{N-1} P_i \cos \theta_i,$$

$$e \sin \phi = \frac{2}{N} \sum_{i=0}^{N-1} P_i \sin \theta_i,$$

$$r = \frac{1}{N} \sum_{i=0}^{N-1} P_i, \text{ and}$$

$P_i$ is the corresponding edge position of the wafer at orientation angle $\theta_i$.

7. The method of claim 6 wherein said orientation angles, $\theta_i$ satisfy the equation $$\theta_i = \frac{2\pi}{N} i$$

for $i=0$ to $N-1$.

8. A method of locating the peripheral flat edge of a wafer comprising,
   (a) placing a wafer onto a wafer chuck rotatable about a rotation axis,
   (b) spinning said wafer about said axis for one 360 degree rotation,
   (c) determining the orientation of said chuck with respect to an initial orientation,
   (d) sampling the position of said edge of said wafer relative to said rotation axis for a plurality of chuck orientations to obtain a set of N data points, each data point i consisting of an orientation angle $\theta_i$ and a corresponding edge position $P_i$,
   (e) calculating from said set of data points a mean r, and cosine and sine components, $e \cos \phi$ and $e \sin \phi$ respectively, of a cosine curve representing expected values $\hat{P}_i$ of said data points,
   (f) subtracting said expected $\hat{P}_i$ at each of said orientation angles $\theta_i$ from said corresponding edge positions $P_i$ to obtain a second set of points $\Delta_i$ representing the deviation of said data points from said cosine curve, and
   (g) finding an orientation $\theta_j$ such that $\Delta_j$ is the minimum in the second set of points, said angle $\theta_j$ being an estimate of a flat edge angle indicating the location of the flat edge of said wafer with respect to said rotation axis.

9. The method of claim 8 wherein said N data points are sampled at incremental orientation angles $$\theta_i = \frac{2\pi}{N} i,$$

for $i=0$ to $N-1$.

10. The method of claim 9 further comprising, calculating a fine adjustment angle $\beta$ to said estimate $\theta_j$ according to the equation $$\beta = \frac{P_b - P_a}{P_b + P_a} \cot\left(\frac{2\pi}{N}\right),$$

where $P_a$ and $P_b$ are edge positions taken from said set of data points for orientation angles immediately preceding and succeeding orientation angle $\theta_j$, and subtracting said angle $\beta$ from angle $\theta_j$ to obtain a truer estimate of said flat edge angle.

11. The method of claim 8 further comprising,
   (h) rotating said wafer about said axis to a preselected orientation with respect to said flat edge angle.

12. The method of claim 8 further comprising,
   (h) selecting first, second, third and fourth data points from said set of data points, said first data point located in a range from 23 to 30 degrees away from said flat edge angle, said third data point located 180 degrees from said first data point, said second and fourth data points being 180 degrees apart from one another and 90 degrees away from said first and third data points respectively, a first line being defined through said rotation axis between said first and third data points, a second line being defined through said rotation axis between said second and fourth data points,
   (i) determining a mean of the edge positions of said first and third data points and subtracting said mean from the edge position of one of said first and third data points to obtain a first value representing the projection of the center of the wafer onto said first line in the direction of said one of said first and third data points from said rotation axis,
   (j) determining a mean of the edge points of said second and fourth data points and subtracting said mean from the edge position of one of said second and fourth data points to obtain a second value representing the projection of the center of the wafer onto said second line in the direction of said one of said second and fourth data points from said rotation axis, and
   (k) moving said wafer on said chuck successively parallel to said first and second lines by the amounts of said first and second values respectively, so that said center of said wafer and said rotation axis coincide.

13. A wafer orientation determining apparatus comprising,
   a wafer chuck for engaging a wafer, said chuck being rotatable about an axis,
   means for rotating said chuck,
   means for determining the orientation of said chuck with respect to an initial orientation and producing a first electrical signal representing an orientation angle of said chuck, means for detecting the position of an edge of said wafer with respect to said axis and producing a second electrical signal representing said wafer edge position, means in electrical communication to receive said first and second electrical signals for producing a plurality of data points therefrom for a plurality of chuck orientations, each data point consisting of an orientation angle and a corresponding edge position, said sampling means producing data signals representing said data points, and computer means connected to said sampling means to operatively receive said data signals for:
(a) fitting a cosine curve to said data points,
(b) subtracting said cosine curve at each of said orientation angles from said corresponding edge position to obtain a deviation, and
(c) determining the orientation angle where said deviation is greatest, said angle representing the location of flat edge of said wafer with respect to said axis of rotation.

14. The wafer orientation apparatus of claim 13 wherein said means for detecting the wafer edge position comprises a linear photodetector array positioned under an edge of said wafer and aligned radially with respect to said axis of rotation, and a light source illuminating said wafer edge and a portion of said linear array not covered by said wafer edge.

15. The wafer orientation apparatus of claim 13 wherein said computer means further calculates a fine adjustment angle $\beta$ from edge positions $P_a$ and $P_b$ taken from data points on said flat edge preceding and succeeding said orientation angle where said deviation is greatest, said angle $\beta$ determined according to the equation:

$$\beta = \frac{P_b - P_a}{P_b + P_a} \cot \theta,$$

where $\theta$ is half the angle between said data points, and subtracts said angle $\beta$ from said orientation angle where said deviation is greatest.

* * * * *

UNITED STATES PATENT AND TRADEMARK OFFICE
CERTIFICATE OF CORRECTION

PATENT NO. : 4,752,898
DATED : June 21, 1988
INVENTOR(S) : Franklin R. Koenig

It is certified that error appears in the above—identified patent and that said Letters Patent is hereby corrected as shown below:

Column 5, line 32, "the expected position $P_i$" should read --the expected position $\hat{P}_i$--.

Column 5, line 64, "these expected measurement are" should read --these expected measurements $\hat{P}_i$ are--.

Column 6, line 30, "for computatioral simplicity" should read --for computational simplicity--.

Column 7, line 45, "$P_2$ and $P_{\frac{N}{2}+2}$," should read --$P_2$ and $P_{\frac{N}{2}+2}$--.

Claim 8, column 9, line 61, "expected $\hat{P}_i$" should read --expected values $\hat{P}_i$--.

Signed and Sealed this

Seventh Day of March, 1989

*Attest:*

DONALD J. QUIGG

*Attesting Officer*   *Commissioner of Patents and Trademarks*